US00RE40068E

(19) United States
(12) Reissued Patent
Cheng

(10) Patent Number: US RE40,068 E
(45) Date of Reissued Patent: Feb. 19, 2008

(54) MULTI-LAYER CIRCUIT BOARD HAVING SIGNAL, GROUND AND POWER LAYERS

(75) Inventor: Yu-Chiang Cheng, Taipei (TW)

(73) Assignees: Mitac Technology Corp., Hsin-Chu Hsien (TW); Mitac International Corp., Hsin-Chu Hsien (TW)

(21) Appl. No.: 10/888,966

(22) Filed: Jul. 9, 2004

Related U.S. Patent Documents

Reissue of:
(64) Patent No.: 6,417,460
Issued: Jul. 9, 2002
Appl. No.: 09/800,412
Filed: Mar. 6, 2001

(51) Int. Cl.
*H05K 1/03* (2006.01)

(52) U.S. Cl. ..... 174/255; 361/792
(58) Field of Classification Search ..... 174/255, 174/260, 262; 361/760, 792, 793, 794, 795
See application file for complete search history.

(56) References Cited

U.S. PATENT DOCUMENTS 3,798,762 A * 3/1974 Harris et al. ..... 29/626
4,285,780 A * 8/1981 Schachter ..... 204/15
4,526,835 A * 7/1985 Takahashi et al. ..... 428/413
4,675,789 A * 6/1987 Kuwabara et al. ..... 361/794
4,830,704 A * 5/1989 Voss et al. ..... 156/629
5,010,641 A * 4/1991 Sisler ..... 29/830
5,400,039 A * 3/1995 Araki et al. ..... 343/760
5,719,750 A * 2/1998 Iwane ..... 361/794
5,786,630 A * 7/1998 Bhansali et al. ..... 257/697
5,796,587 A * 8/1998 Lauffer et al. ..... 361/763
5,840,382 A * 11/1998 Nishide et al. ..... 428/209
6,191,475 B1 * 2/2001 Skinner et al. ..... 257/700
6,229,095 B1 * 5/2001 Kobayashi ..... 174/255
6,261,467 B1 * 7/2001 Giri et al. ..... 216/13

* cited by examiner

*Primary Examiner*—Ishwar (I. B.) Patel
(74) *Attorney, Agent, or Firm*—Merchant & Gould P.C.

(57) ABSTRACT

A multi-layer circuit board includes first, second, third, fourth, fifth, sixth and seventh insulating substrates; first, second, third, fourth and fifth signal wiring layers; first and second ground wiring layers; and a power wiring layer. Each of the first and seventh insulating substrates has a thickness ranging from 2.5 to 6.5 mil. Each of the second, fourth and sixth insulating substrates has a thickness ranging from 3 to 9 mil. Each of the third and fifth insulating substrates has a thickness ranging from 3 to 23 mil. The first signal wiring layer has a first resistance with respect to the first ground wiring layer. The second signal wiring layer has a second resistance with respect to the first ground wiring layer and the power wiring layer. The third signal wiring layer has a third resistance with respect to the first ground wiring layer and the power wiring layer. The fourth signal wiring layer has a fourth resistance with respect to the second ground wiring layer and the power wiring layer. The fifth signal wiring layer has a fifth resistance with respect to the second ground wiring layer. The first, second, third, fourth and fifth resistances are within the range of 49.5 to 60.5 ohms.

17 Claims, 3 Drawing Sheets

MULTI-LAYER CIRCUIT BOARD HAVING SIGNAL, GROUND AND POWER LAYERS

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates to a multi-layer circuit board, more particularly to a multi-layer circuit board which can achieve impedance matching to result in reduced high speed signal reflection and reduced electromagnetic interference.

2. Description of the Related Art

According to industrial standards, multi-layer circuit boards with eight wiring layers generally include the 1.2 mm type and the 1.6 mm type. FIG. 1 shows a conventional multi-layer circuit board with a thickness of about 1.2 mm, which includes: first, second, third, fourth, fifth, sixth and seventh insulating substrates (A1), (A2), (A3), (A4), (A5), (A6), (A7) disposed sequentially one above the other; a first signal wiring layer (S1) disposed on one side of the first insulating substrate (A1) opposite to the second insulating substrate (A2); a first ground wiring layer (GND1) disposed between the first and second insulating substrates (A1) (A2); a second signal wiring layer (S2) disposed between the second and third insulating substrates (A2), (A3); a third signal wiring layer (S3) disposed between the third and fourth insulating substrates (A3), (A4); a power wiring layer (POWER) disposed between the fourth and fifth insulating substrates (A4), (A5); a fourth signal wiring layer (S4) disposed between the fifth and sixth insulating substrates (A5), (A6); a second ground wiring layer (GND2) disposed between the sixth and seventh insulating substrates (A6), (A7); and a fifth signal wiring layer (S5) disposed on one side of the seventh insulating substrate (A7) opposite to the sixth insulating substrate (A6) Each of the first, third, fifth and seventh insulating substrates (A1), (A3), (A5), (A7) is made from a polyester prepreg. Each of the second, fourth and sixth insulating substrates (A2) (A4), (A6) is made from a fibrous core material that contains paper or glass fibers.

In addition, each of the first and seventh insulating substrates (A1), (A7) has a thickness (H4) of about 2.5 mil. Each of the second and sixth insulating substrates (A2), (A6) has a thickness (H3) of about 8 mil. Each of the third and fifth insulating substrates (A3), (A5) has a thickness (H2) of about 5 mil. The fourth insulating substrate (A4) has a thickness (H1) of about 8 mil. The first signal wiring layer (S1) has a first resistance (Rs1) with respect to the first ground wiring layer (GND1). The second signal wiring layer (S2) has a second resistance (Rs2) with respect to the first ground wiring layer (GND1) and the power wiring layer (POWER). The third signal wiring layer (S3) has a third resistance (Rs3) with respect to the first ground wiring layer (GND1) and the power wiring layer (POWER). The fourth signal wiring layer (S4) has a fourth resistance (Rs4) with respect to the second ground wiring layer (GND2) and the power wiring layer (POWER). The fifth signal wiring layer (S5) has a fifth resistance (Rs5) with respect to the second ground wiring layer (GND2). The first and fifth resistances (Rs1), (Rs5) are about 44 ohms. The second, third and fourth resistances (Rs2), (Rs3), (Rs4) are about 51 ohms.

FIG. 2 shows a conventional multi-layer circuit board having a thickness of about 1.6 mm. The 1.6 mm circuit board differs from the above-described 1.2 mm circuit board in that H4 is equal to 9.5 mil, instead of 2.5 mil. Hence, the first and fifth resistances (Rs1), (Rs5) are about 76.4 ohms.

Due to their construction, the conventional multi-layer circuit boards shown in FIGS. 1 and 2 have the following disadvantages:

1. Serious High Speed Signal Reflection

According to the standard theoretical values determined by Intel, the resistance between two adjacent wiring layers for a circuit board during high speed signal transmission is preferably within the range of 55±10% Ω, i.e., between 49.5Ω and 60.5Ω. However, the first and fifth resistances (Rs1), (Rs5), being about 44 ohms, of the aforementioned conventional 1.2 mm circuit board fall outside the preferred range recommended by Intel, and there is additionally a difference of 7 ohms between the value of the first and fifth resistances (Rs1), (Rs5) and that of the second, third and fourth resistances (Rs2), (Rs3), (Rs4) Such a difference will result in an impedance mismatch. Thus, when a high speed signal is being transmitted through the conventional 1.2 mm circuit board and passes from the first or fifth wiring layer (S1) or (S5) to the second, third or fourth wiring layer (S2) or (S3) or (S4), reflection of the signal will result, thereby adversely affecting signal transmission. Likewise, the value of the first and fifth resistances (Rs1), (Rs5) of the aforementioned conventional 1.6 mm circuit board falls outside the theoretical range, and there is a large difference present between the value of the first and fifth resistances (Rs1), (Rs5) and that of the second, third and fourth resistances (Rs2), (Rs3), (Rs4). The reflection index of high-speed signals for the 1.2 mm circuit board can be calculated as follows:

$$\rho = \frac{Z1 - Zo}{Z1 + Zo} = \frac{Rs1 - Rs2}{Rs1 + Rs2} = 0.07$$

The reflection index for the 1.6 mm circuit board can be calculated in a similar manner and is found to be even higher, being 0.2. The signal reflection is therefore very serious, which results in considerable distortion of the waveform and poor signal quality.

(2) Weakened magnetic flux counteraction

As reflection of high speed signals will generate standing waves, which will increase electromagnetic radiation of the high speed signals, the magnetic flux counteraction of the circuit board is weakened, thereby resulting in excessively high electromagnetic interference.

SUMMARY OF THE INVENTION

Therefore, the main object of the present invention is to provide a multi-layer circuit board which can achieve impedance matching to result in reduced high speed signal reflection and reduced electromagnetic interference.

Accordingly, a multi-layer. circuit board according to the present invention includes: first, second, third, fourth, fifth, sixth and seventh insulating substrates disposed sequentially one above the other; a first signal wiring layer disposed on one side of the first insulating substrate opposite to the second insulating substrate; a first ground wiring layer disposed between the first and second insulating substrates; a second signal wiring layer disposed between the second and third insulating substrates; a third signal wiring layer disposed between the third and fourth insulating substrates; a power wiring layer disposed between the fourth and fifth insulating substrates; a fourth signal wiring layer disposed between the fifth and sixth insulating substrates; a second ground wiring layer disposed between the sixth and seventh insulating substrates; and a fifth signal wiring layer disposed on one side of the seventh insulating substrate opposite to the sixth insulating substrate. Each of the first and seventh insulating substrates has a thickness ranging from 2.5 to 6.5 mil. Each of the second, fourth and sixth insulating substrates has a thickness ranging from 3 to 9 mil. Each of the third and fifth insulating substrates has a thickness ranging from 3 to 23 mil. The first signal wiring layer has a first resistance with respect to the first ground wiring layer. The second signal wiring layer has a second resistance with respect to the first ground wiring layer and the power wiring layer. The third signal wiring layer has a third resistance with respect to the first ground wiring layer and the power wiring layer. The fourth signal wiring layer has a fourth resistance with respect to the second ground wiring layer and the power wiring layer. The fifth signal wiring layer has a fifth resistance with respect to the second ground wiring layer. The first, second, third, fourth and fifth resistances are within the range of 49.5 to 60.5 ohms.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
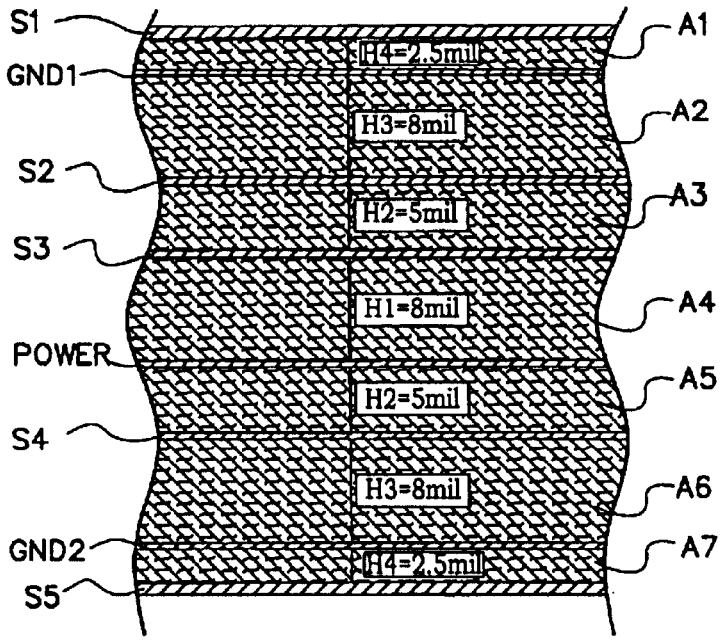
FIG. 1 (PRIOR ART)
FIG. 1 is a schematic view of a conventional multi-layer circuit board with a thickness of about 1.2 mm.
Figure 2:
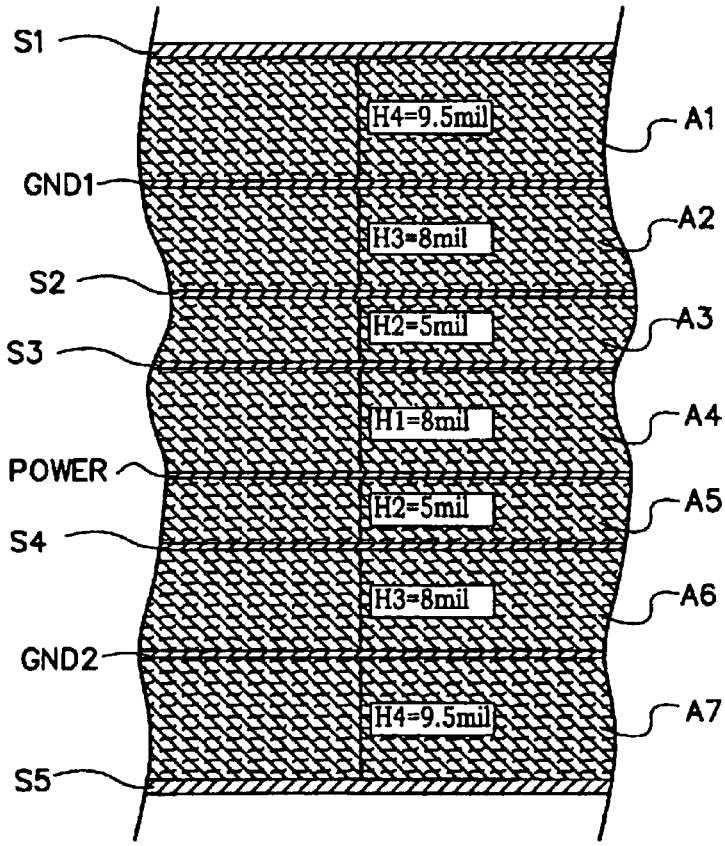
FIG. 2 (PRIOR ART)
FIG. 2 is a schematic view of another conventional multi-layer circuit board with a thickness of about 1.6 mm.

Before the present invention is described in greater detail, it should be noted that like elements are denoted by the same reference numerals throughout the disclosure.

Figure 3:
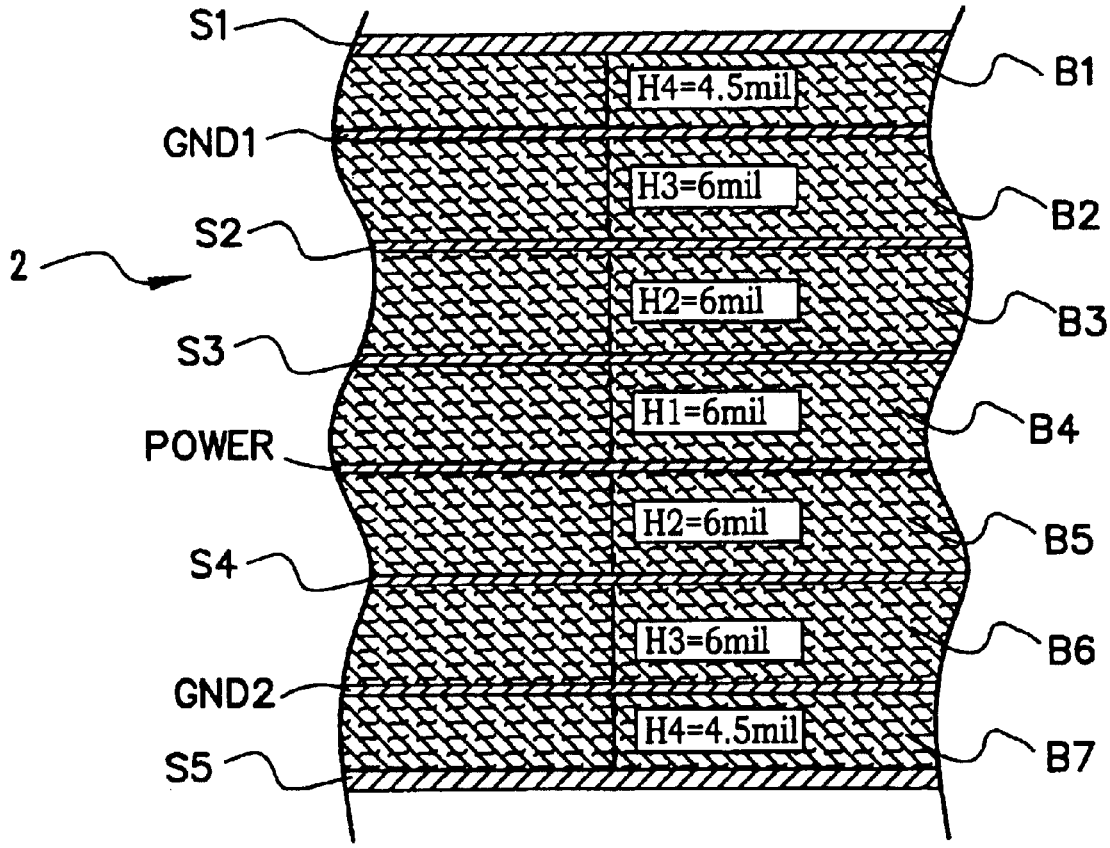
FIG. 3 is a schematic view of the first preferred embodiment of a multi-layer circuit board with a thickness of about 1. 2 mm according to the present invention.
Figure 4:
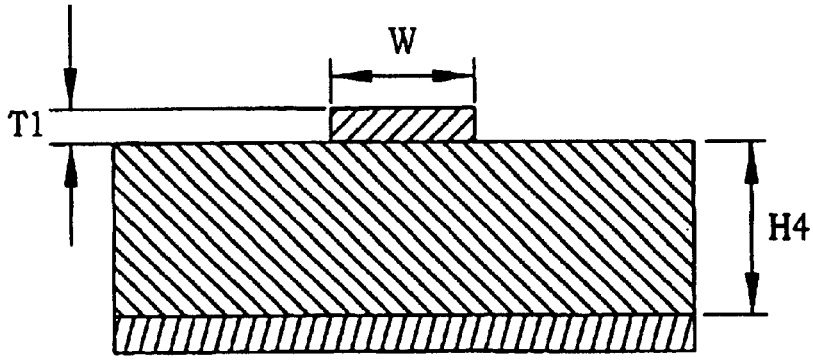
FIG. 4 is a sectional view of the first preferred embodiment in part.
Figure 5:
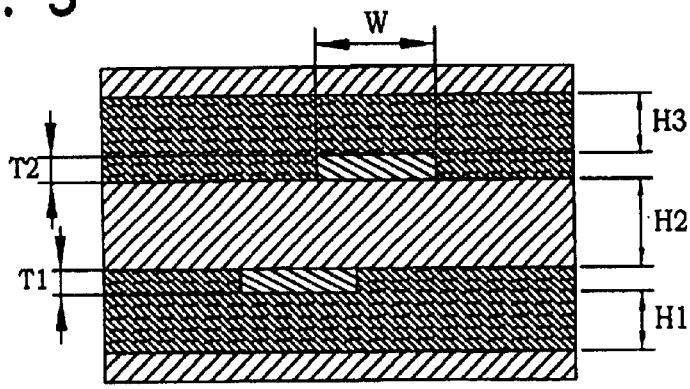
FIG. 5 is another sectional view of the first preferred embodiment in part.

Referring to FIGS. 3 to 5, the first preferred embodiment of a multi-layer circuit board 2 with a thickness of about 1.2 mm according to the present invention is shown to include: first, second, third, fourth, fifth, sixth and seventh insulating substrates (B1), (B2), (B3), (B4), (B5), (B6), (B7) disposed sequentially one above the other; a first signal wiring layer (S1) disposed on one side of the first insulating substrate (B1) opposite to the second insulating substrate (B2); a first ground wiring layer (GND1) disposed between the first and second insulating substrates (B1), (B2); a second signal wiring layer (S2) disposed between the second and third insulating substrates (B2), (B3); a third signal wiring layer (S3) disposed between the third and fourth insulating substrates (B3), (B4); a power wiring layer (POWER) disposed between the fourth and fifth insulating substrates (B4), (B5); a fourth signal wiring layer (S4) disposed between the fifth and sixth insulating substrates (B5), (B6); a second ground wiring layer (GND2) disposed between the sixth and seventh insulating substrates (B6), (B7); and a fifth signal wiring layer (S5) disposed on one side of the seventh insulating substrate (B7) opposite to the sixth insulating substrate (B6). The first, second, third, fourth and fifth signal wiring layers (S1), (S2), (S3), (S4), (S5) are generally made from copper coil. The first and fifth signal wiring layers (S1), (S5) are adapted to be mounted with electronic components (not shown) thereon. At least one of the first, third, fifth and seventh insulating substrates (B1), (B3), (B5), (B7) is made from a polyester prepreg. At least one of the second, fourth and sixth insulating substrates (B2), (B4), (B6) is made from a fibrous core material which contains paper or glass fibers.

According to the present invention, each of the first and seventh insulating substrates (B1), (B7) has a thickness (H4) ranging from 2.5 to 6.5 mil. Each of the second and sixth insulating substrates (B2), (B6) has a thickness (H3) ranging from 3 to 9 mil. Each of the third and fifth insulating substrates (B3), (5) has a thickness (H2) ranging from 3 to 23 mil. The fourth insulating substrate (B4) has a thickness (H1) ranging from 3 to 9 Mil. Preferably, the thicknesses (H4) of the first and seventh insulating substrates (B2), (B7) are equal. The thicknesses (H3) of the second and sixth insulating substrates (B2), (B6) are equal. The thicknesses (H2) of the third and fifth insulating substrates (B3), (B5) are equal.

The first, second, third, fourth, fifth, sixth and seventh insulating substrates (B1), (B2), (B3), (B4), (B5), (B6), (B7), the first, second, third, fourth and fifth signal wiring layers (S1), (S2), (S3), (S4), (S5), and first and second ground wiring layers (GND1), (GND2), and the power wiring layer (POWER) are press-bonded to each other to form the circuit board 2 with a thickness of about 1.2 mm. During press-bonding of the circuit board 2, the third signal wiring layer (S3) and the power wiring layer (POWER) are disposed to sandwich the fourth insulating substrate (B4). Then, the second signal wiring layer (S2) and the third signal wiring layer (S3), and the fourth signal wiring layer (S4) and the power wiring layer (POWER) are disposed to sandwich the third and fifth insulating substrates (B3), (B5), respectively. The first ground wiring layer (GND1) and the second signal wiring layer (S2), and the fourth signal wiring layer (S4) and second ground wiring layer (GND2) are disposed to sandwich the second and sixth insulating substrates (B2), (B6). Finally, the first signal wiring layer (S1) and the first ground wiring layer (GND1), and the fifth signal wiring layer (S5) and the second ground wiring layer (GND2) are disposed to sandwich the first and seventh insulating substrates (B1), (B7) to constitute the 1.2 mm multi-layer circuit board 2.

According to the first preferred embodiment, each of the first and fifth signal wiring layers (S1), (S5) has a thickness of about 1.4 mil. Each of the second, third and fourth signal wiring layers (S2), (S3), (S4), the first and second ground wiring layers (GND1), (GND2), and the power wiring layer (POWER) has a thickness of about 0.7 mil. In addition, each of the third and fifth insulating substrates (B3), (B5) has a preferred thickness (H2) ranging from 3 to 9 mil, more preferably 6 mil. Each of the first and seventh insulating substrates (B1), (B7) has a preferred thickness (H4) of 4.5 mil. Each of the second, fourth, and sixth insulating substrates (B2), (B4), (B6) has a preferred thickness (H3, H1) of 6 ml. The first signal wiring layer (S1) has a first resistance (Rs1) with respect to the first ground wiring layer (GND1). The second signal wiring layer (S2) has a second resistance (Rs2) with respect to the first ground wiring layer (GND1) and the power wiring layer (POWER). The third signal wiring layer (S3) has a third resistance (Rs3) with respect to the first ground wiring layer (GND1) and the power wiring layer (POWER). The fourth signal wiring layer (S4) has a fourth resistance (Rs4) with respect to the second ground wiring layer (GND2) and the power wiring layer (POWER). The fifth signal wiring layer (S5) has a fifth resistance (Rs5) with respect to the second ground wiring layer (Rs2). With the thicknesses of the insulating substrates (B1), (B2), (B3), (B4), (B5), (B6), (B7) controlled to be within the aforementioned ranges, the first, second, third, fourth and fifth resistances (Rs1), (Rs2), (Rs3), (Rs4), (Rs5) can be kept within the range of 49.5 to 60.5 ohms to thereby achieve impedance matching.

The calculation of the approximate thickness of each of the insulating substrates (B1), (B2), (B3), (B4), (B5), (B6) and (B7) is explained in the following description.

Firstly, the value of the first and fifth resistances (Rs1), (R5) is calculated using the following Formula (1):

$$Rs1 = Rs5 = \frac{87}{\sqrt{E_R + 1.41}} \ln\left\{\frac{5.98H4}{0.8W = T1}\right\} \quad 1$$

wherein $E_R$ is the dielectric coefficient and is equal to 4.5; H4 is the thickness of the first and seventh insulating substrates (B1), (B7); W is the width of traces of the first and fifth signal wiring layers (S1), (S5) and is within the range of 2 to 8 mil and is equal to 5 mil in this preferred embodiment; and Ti is the thickness of the first and fourth signal wiring layer (S1), (S4) and is equal to 1.4 mil.

Next, the value of the second and third resistances (Rs2), (Rs3) is obtained using the following Formulae (2) and (3):

$$Rs2 = Rs3 = \frac{2YZ}{Y + Z}\Big\} \quad 2$$

$$Y = \frac{60}{\sqrt{ER}} \ln\left\{\frac{8H3}{0.67\pi W\left(0.8 + \frac{T2}{W}\right)}\right\}$$

$$Z = \frac{60}{\sqrt{ER}} \ln\left\{\frac{8(H3 + H2)}{0.67\pi W\left(0.8 + \frac{T2}{W}\right)}\right\} \quad 3$$

wherein $E_R$ is the dielectric coefficient and is equal to 4.5; H3 is the thickness of the second and sixth insulating substrates (B2), (B6) and is equal to H1, the thickness of the fourth insulating substrate (B4); H2 is the thickness of the third and fifth insulating substrates (B3), (B5); T2 is the thickness of the second signal wiring layer (S2) and is equal to 0.7 mil, which is also the thickness of the third signal wiring layer (S3); and W is the width of traces of the second and third signal wiring layers (S2), (S3) and is within the range of 2 to 8 mil. In this preferred embodiment, W is equal to 5 mil.

The value of the fourth resistance (Rs4) is obtained using the following Formula (4):

$$Rs4 = \frac{60}{\sqrt{ER}} \ln\left\{\frac{4(H2 + H3)}{0.67\pi W\left(0.8 + \frac{T2}{W}\right)}\right\} \quad 4$$

wherein $E_R$ is the dielectric coefficient and is equal to 4.5; 1H3 is the thickness of the second and sixth insulating substrates (B2), (B6); H2 is the thickness of the third and fifth insulating substrates (B3), (B5); T2 is the thickness of the fourth signal wiring layer (S4) and is equal to 0.7 mil; and W is the width of traces of the fourth signal wiring layer (S4) and is within the range of 2 to 8 mil. In this preferred embodiment, W is equal to 5 mil.

2H4+2H3+2H2+1H1+2T1+6T2=48 mil 5

In addition, the total thickness of the circuit board should be equal to 1.2 mm (equivalent to about 48 mil) or within a tolerance range thereof, as expressed by the Formula (5). Based on the above Formula (5), the preferred value of thickness of each of the insulating substrates can be obtained. That is, when H1, the thickness of the fourth insulating substrate (B4) is within the range of 3 to 9 mil, H1 is preferably equal to 6 mil. When H2, the thickness of the third and fifth insulating substrates (B3), (B5) is within the range of 3 to 9 mil, H2 is preferably equal to 6 mil. When H3, the thickness of the second and sixth insulating substrates (B2), (B6) is within the range of 3 to 9 mil, H3 is preferably equal to 6 mil. When H4, the thickness of the first and seventh insulating substrates (B1), (B7) is within the range of 2.5 to 6.5 mil, H4 is preferably equal to 4.5 mil. Under this condition, the first and fifth resistances (Rs1), (Rs5) are about 58 ohms. The second and third resistances (Rs2), (Rs3) are about 57 ohms. The fourth resistance (Rs4) is about 50 ohms. All of these resistance values fall within the theoretical range of 49.5 to 60.5 ohms recommended by Intel for high speed signal transmission. Besides, the total thickness of the circuit board 2 fulfills the Formula (5) in which 2H4+2H3+2H2+1H1+2T1+6T2=2×4.5 mil+2×6 mil+1×6 mil+2×1.4 mil+6×0.7 mil=46 mil=1.2 mm (within tolerance range).

Figure 6:
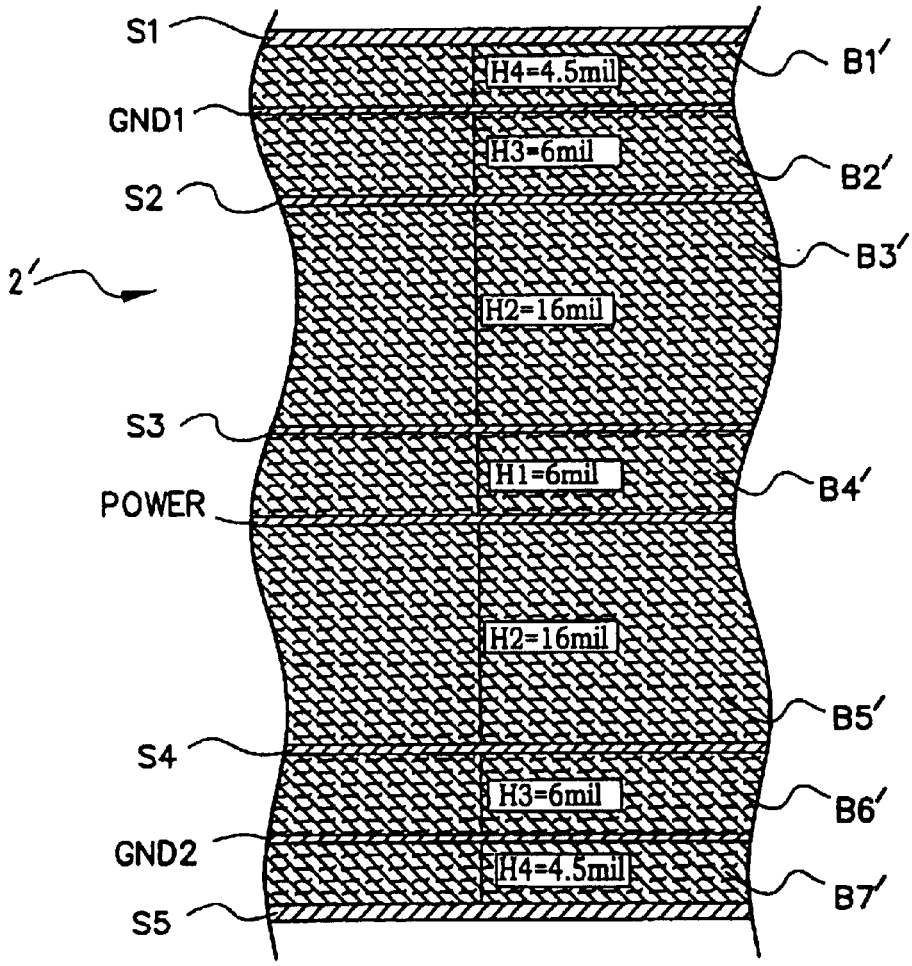
FIG. 6 is a schematic view of the second preferred embodiment of a multi-layer circuit board with a thickness of about 1.6 mm according to the present invention.

FIG. 6 shows the second preferred embodiment of a multi-layer circuit board 2' according to the present invention. The circuit board 2' is shown to include first, second, third, fourth, fifth, sixth and seventh insulating substrates (B1'), (B2'), (B3'), (B4'), (B5'), (B6'), (B7'), first, second, third, fourth and fifth signal wiring layers (S1), (S2), (S3), (S4), (S5), first and second ground wiring layers (GND1), (GND2), and a power wiring layer (POWER), all of which are press-bonded to each other to form the circuit board 2' with a thickness of about 1.6 mm. This preferred embodiment differs from the previous embodiment in that each of third and fifth insulating substrates (B3'), (B5') has a thickness (H2) ranging from 9 to 23 mil. After a calculation based on the above formulae, the following preferred values for H1, H2, H3 and H4 are obtained. H1 is preferably within the range of 3 to 9 mil, and is more preferably equal to 6 Mil. H2 is preferably within the range of 9 to 23 mil, and is more preferably equal to 16 mil. H3 is preferably within the range of 3 to 9 mil, and is more preferably equal to 6 mil. H4 is preferably within the range of 2.5 to 6.5 mil, and is more preferably equal to 4.5 mil. As such, the first and fifth resistances are about 60 ohms. The second and third resistances are about 55 ohms. The fourth resistance is about 60 ohms. All of these resistance values fall within the theoretical range recommended by Intel.

Accordingly, the multi-layer circuit board of the present invention has the following advantages:

1. Reduced High Speed Signal Reflection

Since the resistances in both of the first and second preferred embodiments all fall within the recommended range of 55Ω±10%, the reflection indexes are substantially low as compared to those in the prior art. Therefore, reflection of high speed signals can be significantly reduced to make the circuit board highly suitable for high speed signal transmission.

2. Reduced Electromagnetic Interference

As a result of reduced high speed signal reflection, generation of standing waves in not likely. Hence, magnetic flux counteraction can be enhanced to reduce electromagnetic interference to meet current EMI standards.

3. Better Adaptability for High Speed Signal Layout

In view of the aforementioned advantages, the circuit board of this invention is suited for high speed signal layout to meet the current trend in the industry toward high speed signal development and to enhance market value of products and market competitiveness.

4. Enhanced Layout Time Efficiency

Due to impedance matching, there is no need to alter the width of traces of the signal wiring layers, thereby improving the layout time efficiency.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A multi-layer circuit board comprising:

first, second, third, fourth, fifth, sixth and seventh insulating substrates disposed sequentially one above the other;

a first signal wiring layer disposed on one side of said first insulating substrate opposite to said second insulating substrate;

a first ground wiring layer disposed between said first and second insulating substrates;

a second signal wiring layer disposed between said second and third insulating substrates;

a third signal wiring layer disposed between said third and fourth insulating substrates;

a power wiring layer disposed between said fourth and fifth insulating substrates;

a fourth signal wiring layer disposed between said fifth and sixth insulating substrates;

a second ground wiring layer disposed between said sixth and seventh insulating substrates; and a fifth signal wiring layer disposed on one side of said seventh insulating substrate opposite to said sixth insulating substrate;

wherein each of said first and seventh insulating substrates has a thickness ranging from 2.5 to 6.5 mil;

wherein each of said second, fourth and sixth insulating substrates has a thickness ranging from 3 to 9 mil;

wherein each of said third and fifth insulating substrates has a thickness ranging from 3 to 23 mil;

wherein said first signal wiring layer has a first resistance with respect to said first ground wiring layer, said second signal wiring layer having a second resistance with respect to said first ground wiring layer and said power wiring layer, said third signal wiring layer having a third resistance with respect to said first ground wiring layer and said power wiring layer, said fourth signal wiring layer having a fourth resistance with respect to said second ground wiring layer and said power wiring layer, said fifth signal wiring layer having a fifth resistance with respect to said second ground wiring layer; and wherein said first, second, third, fourth and fifth resistances are within the range of 49.5 to 60.5 ohms.

2. The multi-layer circuit board of claim 1, wherein at least one of said first, third, fifth and seventh insulating substrates is made from a polyester prepreg.

3. The multi-layer circuit board of claim 1, wherein at least one of said second, fourth and sixth insulating substrates is made from a fibrous core material.

4. The multi-layer circuit board of claim 3, wherein the core material contains paper fibers.

5. The multi-layer circuit board of claim 3, wherein the core material contains glass fibers.

6. The multi-layer circuit board of claim 1, wherein the thicknesses of said first and seventh insulating substrates are equal.

7. The multi-layer circuit board of claim 1, wherein the thicknesses of said second and sixth insulating substrates are equal.

8. The multi-layer circuit board of claim 1, wherein the thicknesses of said third and fifth insulating substrates are equal.

9. The multi-layer circuit board of claim 1, wherein:

each of said first and fifth signal wiring layers has a thickness of about 1.4 mil; and each of said second, third and fourth signal wiring layers, said first and second ground wiring layers, and said power wiring layer has a thickness of about 0.7 mil.

10. The multi-layer circuit board of claim 1, wherein each of said third and fifth insulating substrates has a thickness ranging from 3 to 9 mil.

11. The multi-layer circuit board of claim 10, wherein:

each of said first and seventh insulating substrates has a thickness of 4.5 mil;

each of said second, third, fourth, fifth and sixth insulating substrates has a thickness of 6 mil; and said first, second, third, fourth, fifth, sixth and seventh insulating substrates, said first, second, third, fourth and fifth signal wiring layers, said first and second ground wiring layers, and said power wiring layer are press-bonded to each other to form said circuit board with a thickness of about 1.2 mm.

12. The multi-layer circuit board of claim 1, wherein each of said third and fifth insulating substrates has a thickness ranging from 9 to 23 mil.

13. The multi-layer circuit board of claim 12, wherein:

each of said first and seventh insulating substrates has a thickness of 4.5 mil;

each of said second, fourth and sixth insulating substrates has a thickness of 6 mil;

each of said third and fifth insulating substrates has a thickness of 16 mil; and said first, second, third, fourth, fifth, sixth and seventh insulating substrates, said first, second, third, fourth and fifth signal wiring layers, said first and second ground wiring layers, and said power wiring layer are press-bonded to each other to form said circuit board with a thickness of about 1.6 mm.

*14. A multi-layer circuit board comprising:*

*first, second, third, fourth, fifth, sixth and seventh insulating substrates disposed sequentially one above the other;*

*a first signal wiring layer disposed on one side of said first insulating substrate opposite to said second insulating substrate;*

*a first wiring layer disposed between said first and second insulating substrates;*

*a second signal wiring layer disposed between said second and third insulating substrates;*

*a third signal wiring layer disposed between said third and fourth insulating substrates;*

*a second wiring layer disposed between said fourth and fifth insulating substrates;*

*a fourth signal wiring layer disposed between said fifth and sixth insulating substrates;*

*a third wiring layer disposed between said sixth and seventh insulating substrates; and*

*a fifth signal wiring layer disposed on one side of said seventh insulating substrate opposite to said sixth insulating substrate;*

*wherein each of said first and seventh insulating substrates has a thickness ranging from 2.5 to 6.5 mil;*

*wherein each of said second, fourth and sixth insulating substrates has a thickness ranging from 3 to 9 mil;*

*wherein each of said third and fifth insulating substrates has a thickness ranging from 3 to 23 mil;*

*wherein a signal trace of said first signal wiring layer has a first resistance with respect to said first wiring layer, a signal trace of said second signal wiring layer having a second resistance with respect to said first and second wiring layers, a signal trace of said third signal wiring layer having a third resistance with respect to said first and second wiring layers, a signal trace of said fourth signal wiring layer having a fourth resistance with respect to said second and third wiring layers, a signal trace of said fifth signal wiring layer having a fifth resistance with respect to said third wiring layer; and*

*wherein said first, second, third, fourth and fifth resistances are within the range of 49.5 to 60.5 ohms.*

*15. The multi-layer circuit board of claim 14, wherein one of said first, second, and third wiring layers is a ground wiring layer.*

*16. The multi-layer circuit board of claim 14, wherein one of said first, second, and third wiring layers is a power wiring layer.*

*17. The multi-layer circuit board of claim 14, wherein said first, second, and third wiring layers are a first ground wiring layer, a power wiring layer, and a second ground wiring layer, respectively.*

* * * * *